US010446542B1

United States Patent
Kinzer

(10) Patent No.: US 10,446,542 B1
(45) Date of Patent: *Oct. 15, 2019

(54) GAN STRUCTURES

(71) Applicant: Navitas Semiconductor, Inc., El Segundo, CA (US)

(72) Inventor: Daniel Marvin Kinzer, El Segundo, CA (US)

(73) Assignee: Navitas Semiconductor, Inc., El Segundo, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/960,396

(22) Filed: Apr. 23, 2018

Related U.S. Application Data

(63) Continuation of application No. 14/857,497, filed on Sep. 17, 2015, now Pat. No. 9,960,154.

(Continued)

(51) Int. Cl.
   *H01L 27/06* (2006.01)
   *H01L 29/205* (2006.01)
   (Continued)

(52) U.S. Cl.
   CPC ...... *H01L 27/0605* (2013.01); *H01L 27/0629* (2013.01); *H01L 29/205* (2013.01); *H01L 29/402* (2013.01); *H01L 29/66212* (2013.01); *H01L 29/66462* (2013.01); *H01L 29/778* (2013.01); *H01L 29/7786* (2013.01);
   (Continued)

(58) Field of Classification Search
   CPC ............. H01L 27/0605; H01L 27/0629; H01L 29/66462; H01L 29/402; H01L 29/778
   See application file for complete search history.

(56) References Cited

U.S. PATENT DOCUMENTS 9,960,154 B2 * 5/2018 Kinzer ................ H01L 27/0605
2010/0025730 A1 2/2010 Heikman et al.
(Continued)

FOREIGN PATENT DOCUMENTS

| TW | 201414200 A | 4/2014 |
| TW | 201618276 | 5/2016 |
| WO | 2013147710 A1 | 10/2013 |

OTHER PUBLICATIONS

Advisory Action with notification date of Dec. 15, 2017 in U.S. Appl. No. 14/857,497, 2 pages (of-record in parent application).

(Continued)

*Primary Examiner* — Joseph C. Nicely
(74) *Attorney, Agent, or Firm* — Kilpatrick Townsend & Stockton LLP

(57) ABSTRACT

A semiconductor device is disclosed. The device includes a substrate including GaN, a two dimensional electron gas (2DEG) inducing layer on the substrate, and a lateral transistor on the 2DEG inducing layer. The lateral transistor includes source and drain contacts to the 2DEG inducing layer, a gate stack between the source and drain contacts, and a field plate between the gate and the drain contact. The device also includes one or more insulation layers on the 2DEG inducing layer, where the field plate is spaced apart from the 2DEG inducing layer by the insulation layers, and a conductor on the insulation layers, where a first portion of the conductor is spaced apart from the 2DEG inducing layer by the insulation layers by a distance less than 200 nm.

20 Claims, 5 Drawing Sheets

Related U.S. Application Data

(60) Provisional application No. 62/052,899, filed on Sep. 19, 2014.

(51) Int. Cl.
*H01L 29/40* (2006.01)
*H01L 29/66* (2006.01)
*H01L 29/778* (2006.01)
*H01L 29/872* (2006.01)
*H01L 29/94* (2006.01)
H01L 21/8252 (2006.01)
H01L 29/20 (2006.01)

(52) U.S. Cl.
CPC ............ *H01L 29/872* (2013.01); *H01L 29/94* (2013.01); *H01L 21/8252* (2013.01); *H01L 29/2003* (2013.01); *H01L 29/7783* (2013.01)

(56) References Cited

U.S. PATENT DOCUMENTS

| | | |
|---|---|---|
| 2010/0140660 A1 | 6/2010 | Wu et al. |
| 2011/0049526 A1 | 3/2011 | Chu et al. |
| 2011/0212585 A1 | 9/2011 | Huang et al. |
| 2012/0220089 A1 | 8/2012 | Imada et al. |
| 2013/0056744 A1 | 3/2013 | Mishra et al. |
| 2013/0193485 A1 | 8/2013 | Akiyama et al. |
| 2013/0248931 A1 | 9/2013 | Saito et al. |
| 2014/0001479 A1 | 1/2014 | Kudymov et al. |
| 2014/0091311 A1 | 4/2014 | Jeon et al. |
| 2014/0092637 A1 | 4/2014 | Minoura et al. |
| 2014/0092638 A1 | 4/2014 | Nishimori et al. |
| 2014/0337603 A1 | 11/2014 | Watanabe et al. |
| 2014/0353673 A1 | 12/2014 | Kotani et al. |
| 2014/0361343 A1 | 12/2014 | Sriram |
| 2015/0137135 A1 | 5/2015 | Hill et al. |
| 2015/0162424 A1 | 6/2015 | Briere et al. |
| 2015/0255547 A1 | 9/2015 | Yuan et al. |
| 2015/0263001 A1 | 9/2015 | Saito et al. |
| 2015/0357422 A1 | 12/2015 | Liao |
| 2016/0013179 A1 | 1/2016 | Miura |
| 2016/0086938 A1 | 3/2016 | Kinzer |
| 2017/0025267 A1 | 1/2017 | Chu et al. |

OTHER PUBLICATIONS

Corrected Notice of Allowance with notification date of Feb. 13, 2018 in U.S. Appl. No. 14/857,497, 6 pages (of-record in parent application).

Final Office Action with notification date of Aug. 31, 2017 in U.S. Appl. No. 14/857,497, 18 pages (of-record in parent application).

Non-Final Office Action with notification date of Feb. 9, 2017 in U.S. Appl. No. 14/857,497, 30 pages (of-record in parent application).

Notice of Allowance with notification date of Jan. 25, 2018 in U.S. Appl. No. 14/857,497, 11 pages (of-record in parent application).

Restriction Requirement with notification date of Sep. 28, 2016 in U.S. Appl. No. 14/857,497, 6 pages (of-record in parent application).

Office Action TW104131007 dated Jul. 31, 2018, 9 pages.

* cited by examiner

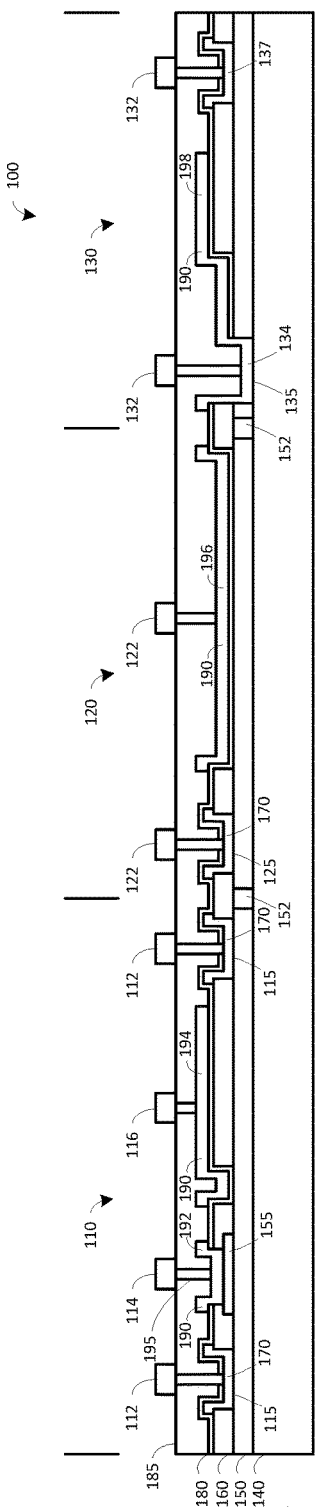
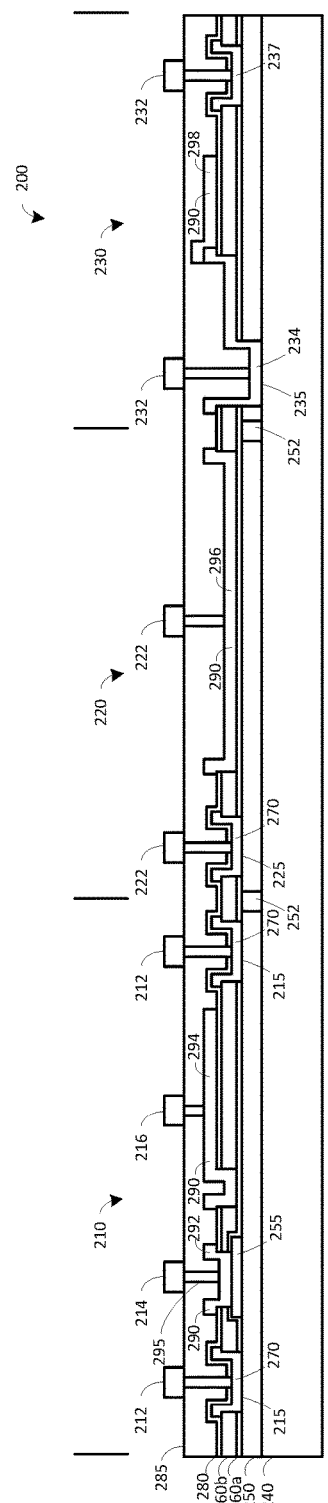
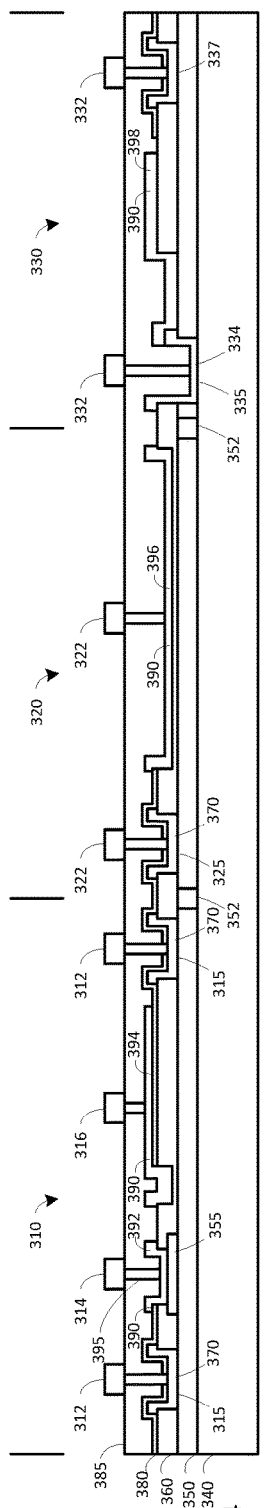
Figure 2
Figure 3
Figure 4

GAN STRUCTURES

CROSS-REFERENCES TO RELATED APPLICATIONS

This application is a continuation of U.S. application Ser. No. 14/857,497, filed Sep. 17, 2015, titled "GaN Structures," which claims the benefit of Provisional Application No. 62/052,899, filed Sep. 19, 2014 titled "IMPROVED GaN STRUCTURES", which are hereby incorporated by reference in their entirety for all purposes.

FIELD

The present invention relates generally to semiconductor devices and in particular to Gallium Nitride (GaN) based devices.

BACKGROUND

In semiconductor technology, GaN is used to form various integrated circuit devices, such as high power field-effect transistors, metal insulator semiconductor field effect transistors (MISFETs), high frequency transistors, high power Schottky rectifiers, and high electron mobility transistors (HEMTs). These devices can be formed by growing epitaxial layers, which can be grown on silicon, silicon carbide, sapphire, gallium nitride, or other substrates. Often, devices are formed using a heteroepitaxial junction of AlGaN and GaN. This structure is known to form a high electron mobility two-dimensional electron gas (2DEG) at the junction. Sometimes additional layers are added to improve or modify the charge density and mobility of electrons in the 2DEG. In a conventional GaN transistor, the device is normally in a conducting, or "on" state. In some applications it may be desirable to have other normal states of GaN devices that may provide improved efficiency, performance or other features.

SUMMARY OF THE INVENTION

One inventive aspect is a semiconductor device. The device includes a substrate including GaN, a two dimensional electron gas (2DEG) inducing layer on the substrate, and a lateral transistor on the 2DEG inducing layer. The lateral transistor includes source and drain contacts to the 2DEG inducing layer, a gate stack between the source and drain contacts, and a field plate between the gate and the drain contact. The device also includes one or more insulation layers on the 2DEG inducing layer, where the field plate is spaced apart from the 2DEG inducing layer by the insulation layers, and a conductor on the insulation layers, where a first portion of the conductor is spaced apart from the 2DEG inducing layer by the insulation layers by a distance less than 200 nm.

Another inventive aspect is a semiconductor device. The device includes a substrate including GaN, a two dimensional electron gas (2DEG) inducing layer on the substrate, and a lateral transistor on the 2DEG inducing layer. The lateral transistor includes source and drain contacts to the 2DEG inducing layer, a gate stack between the source and drain contacts, and a field plate between the gate and the drain contact. The device also includes one or more insulation layers on the 2DEG inducing layer, where the field plate is spaced apart from the 2DEG inducing layer by the insulation layers, where at least one of the insulation layers contacts the 2DEG inducing layer, and where at least one of the insulation layers includes an opening, and a conductor having a first portion in the opening, where the conductor contacts the at least one insulation layer which contacts the 2DEG inducing layer.

Another inventive aspect is a semiconductor device. The device includes a substrate including GaN, a two dimensional electron gas (2DEG) inducing layer on the substrate, and a lateral transistor on the 2DEG inducing layer. The lateral transistor includes source and drain contacts to the 2DEG inducing layer, a gate stack between the source and drain contacts, and a field plate between the gate and the drain contact. The device also includes one or more insulation layers on the 2DEG inducing layer, where a first portion of the field plate is spaced apart from the 2DEG inducing layer by the insulation layers, and where the first portion of the field plate is configured to substantially prevent electronic conduction in a portion of the 2DEG inducing layer when applied with a potential of 40 V less than the adjacent 2DEG inducing layer.

Another inventive aspect is an electronic component, including a package base, and at least one GaN-based die secured to the package base and including an electronic circuit. The electronic circuit includes a substrate including GaN, a two dimensional electron gas (2DEG) inducing layer on the substrate, and a lateral transistor on the 2DEG inducing layer. The lateral transistor includes source and drain contacts to the 2DEG inducing layer, a gate stack between the source and drain contacts, and a field plate between the gate and the drain contact. The electronic circuit also includes one or more insulation layers on the 2DEG inducing layer, where the field plate is spaced apart from the 2DEG inducing layer by the insulation layers, and a conductor on the insulation layers, where a first portion of the conductor is spaced apart from the 2DEG inducing layer by the insulation layers by a distance less than 200 nm.

Another inventive aspect is an electronic component, including a package base, and at least one GaN-based die secured to the package base and including an electronic circuit. The electronic circuit includes a substrate including GaN, a two dimensional electron gas (2DEG) inducing layer on the substrate, and a lateral transistor on the 2DEG inducing layer. The lateral transistor includes source and drain contacts to the 2DEG inducing layer, a gate stack between the source and drain contacts, and a field plate between the gate and the drain contact. The electronic circuit also includes one or more insulation layers on the 2DEG inducing layer, where the field plate is spaced apart from the 2DEG inducing layer by the insulation layers, where at least one of the insulation layers contacts the 2DEG inducing layer, and where at least one of the insulation layers includes an opening, and a conductor having a first portion in the opening, where the first portion of the conductor contacts the at least one insulation layer which contacts the 2DEG inducing layer.

Another inventive aspect is an electronic component, including a package base, and at least one GaN-based die secured to the package base and including an electronic circuit. The electronic circuit includes a substrate including GaN, a two dimensional electron gas (2DEG) inducing layer on the substrate, and a lateral transistor on the 2DEG inducing layer. The lateral transistor includes source and drain contacts to the 2DEG inducing layer, a gate stack between the source and drain contacts, and a field plate between the gate and the drain contact. The electronic circuit also includes one or more insulation layers on the 2DEG inducing layer, where a first portion of the field plate is spaced apart from the 2DEG inducing layer by the insulation layers, and where the first portion of the field plate is configured to substantially prevent electronic conduction in a portion of the 2DEG inducing layer when applied with a potential of 40 V less than the adjacent 2DEG inducing layer.

BRIEF DESCRIPTION OF THE DRAWINGS

FIG. 2 is a cross-sectional view of a semiconductor device.

FIG. 3 is a cross-sectional view of a semiconductor device.

FIG. 4 is a cross-sectional view of a semiconductor device.

DETAILED DESCRIPTION

Figure 1:
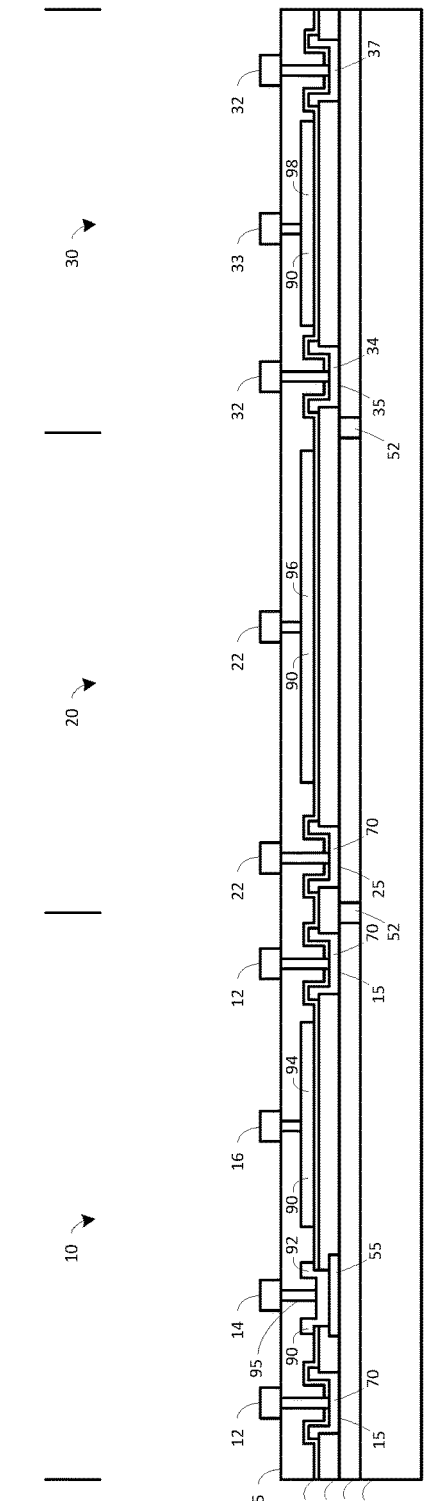
FIG. 1 is a cross-sectional view of a semiconductor device.

Certain embodiments of the present invention relate to GaN transistors having insulated metal layers that may be used to form capacitive structures and for blocking high voltages applied between device structures.

In some GaN-based devices the fields in a high voltage blocking structure may be limited and controlled. A uniform electric field at the surface of such a structure may allow the structure to block a voltage that is close to the theoretical limit of the device. This limit may be defined by the critical field of the semiconductor material and the separation distance between the two terminals that have the high voltage potential between them. As an illustrative example, in some GaN-based materials the critical field may be approximately 300V/micron. Therefore, the theoretical limit of a device with a 2 micron separation would be approximately 600V, assuming the electric field was uniform. In some applications it may be desirable to operate as close as possible to this limit, because more transistors or lower resistance transistors can be formed in a smaller area, or a higher blocking voltage can be achieved in the same area. In either case, the power density of the transistor structure may be improved as the blocking structure performance approaches the theoretical limit.

As another illustrative example, some 600V rated GaN transistors may have separations that can be as much as 10× larger, because the field may not be uniform, and because other undesirable effects can arise when an electric field is that high. In particular, in some applications, hot carriers can be formed that are injected into insulating layers above and below the device. These carriers can then be trapped, and can alter and/or degrade the characteristics of the device. One consequence of these trapped charges can be a reduction in the density of electrons in the two-dimensional electron gas (2DEG) region. This reduction may cause a higher on-state resistance that may result in a higher voltage drop during current conduction and higher energy losses. This reduction can be very temporary, decaying away in microseconds, or can be longer lasting, such as minutes, hours, or even days. In addition, long term exposure to high fields can increase the leakage of the device or even lead to physical damage, overheating, or catastrophic failure of the voltage blocking structure.

To address these issues, some embodiments may include a metal layer situated close to the semiconductor surface, separated from the device by an insulator. In one embodiment the thickness of the insulator may be about 15 nm, 25 nm, 50 nm, 75 nm, 100 nm, 200 nm, 400 nm, or 500 nm. Other embodiments may use different thicknesses depending on the particular manufacturing process employed and the desired device characteristics. The metal layer can be used for any of various purposes, as discussed in more detail below. In one embodiment the insulated metal layer forms a capacitor between the metal layer and the 2DEG, which has a high capacitance per unit area (C/A). In another embodiment, the insulated metal layer may form a normally on transistor structure that can be used in conjunction with a normally off transistor formed with a composite gate structure. In yet another embodiment, the insulated metal layer may be used to form a field plate that shields adjacent structures from high electric fields when a high voltage is applied to a terminal on the opposite side of the field plate from those adjacent structures. In some embodiments a combination of multiple field plates or a stepped field plate can be used with various separation distances from the semiconductor surface to cause a gradual increase of voltage and a more uniform electric field between the low voltage structures and the high voltage terminal. In one embodiment, the first field plate or first field plate portion next to low voltage structures may be located closer to the semiconductor surface than the other field plates, thereby improving effectiveness at preventing high fields from reaching those structures. The low voltage structures may consist of, for example, the gate of a normally off HEMT transistor, the Schottky metal anode of a high power Schottky diode or another structure.

The metal layer may be employed in myriad GaN device manufacturing processes and devices. As non-limiting examples for illustrative purposes only, certain devices and a metal layer formed in certain GaN device manufacturing processes are briefly discussed below.

FIG. 1 is a cross-sectional view of a semiconductor device 1. Device 1 includes transistor 10, capacitor 20, and Schottky diode 30. Transistor 10 includes source/drain electrodes 12, gate electrode 14, and field plate electrode 16. Capacitor 20 includes electrodes 22, and Schottky diode 30 includes cathode and anode electrodes 32 and field plate electrode 33.

Transistor 10, capacitor 20, and Schottky diode 30 are formed on GaN substrate 40, which in some embodiments, is a GaN buffer layer over another substrate.

A 2DEG inducing layer 50 is formed over substrate 40. In some embodiments, the 2DEG (2 dimensional electron gas) is induced by a combination of piezoelectric effect (stress), bandgap differential, and polarization charge. For example, there may be a reduction in the conduction band at the surface, where it drops below the fermi level to create a potential well which fills with electrons. In some embodiments, the 2DEG inducing layer 50 comprises AlGaN in a range, for example, of Al(25%)Ga(75%)N about 20 nm thick. In alternative embodiments, the 2 inducing layer may comprise ALN, AlGaInN, or another material. In some embodiments, the 2DEG inducing layer 50 comprises a thin boundary layer with high Al content and a thicker layer with less Al content. The 2DEG inducing layer 50 may have a GaN cap layer. In some embodiments, the 2DEG inducing layer 50 does not have a GaN cap layer.

In some embodiments, a 2DEG results from rectangular quantum wells. For example, two closely spaced heterojunction interfaces may be used to confine electrons to a rectangular quantum well.

To isolate carriers between the electrical elements, isolation regions 52 are formed. Isolation regions 52 are electrically insulative, and prevent conduction between adjacent electrical elements. In some embodiments, isolation regions 52 are formed by ion bombardment using a neutral species, such as oxygen, nitrogen, or argon. Isolation between adjacent elements results from damage to lattice the 2DEG inducing layer 50. Alternatively, isolation regions 52 may be formed by implanting a chemical species which, either by itself or in combination with other dopants, creates a chemically active deep-level state.

A gate stack 55 is formed over the 2DEG inducing layer 50. For example, the gate stack 55 may include several layers of compound semiconductors which each include nitrogen and one or more elements from column 3 of the periodic table, such as aluminum or gallium or indium or others (i.e., 3N layers). These layers can be doped or undoped. If they are doped they may be doped with either N-type or P-type dopants. Gate stacks corresponding with insulated gates, Schottky gates, PN gates, recessed gates, and other gates may be used.

A relatively thick insulator layer 60, such as silicon nitride (e.g., Si3N4, Si2N, or SN) can be deposited over the gate stack 55. In some embodiments, the thick insulator layer 60 comprises only a single layer of insulator material. In some embodiments, the thickness of the thick insulator layer 60 may be, for example, about 200 nm, 300 nm, 400 nm, 500 nm, or 600 nm. In some embodiments, the thick insulator layer 60 comprises only a single layer of insulator material. The thick insulator layer 60 can be planarized, using, for example, chemo-mechanical polishing, or other techniques.

An opening may be formed in the thick insulator 62 exposing Schottky contact region 35 for Schottky diode 30. Schottky contact 34 may be formed in the Schottky contact region 35, for example, by depositing and patterning a Schottky metal. In some embodiments, for example, this metal could be nickel, platinum, palladium, molybdenum, tungsten, titanium, titanium nitride, titanium tantalum, tantalum nitride, cobalt, or silicides of these metals.

Additional openings may be formed in the thick insulator layer 60 to expose source and drain ohmic contact regions 15 for transistor 10, an ohmic contact region 25 for capacitor 20, and an ohmic contact region 37 for Schottky diode 30. An ohmic metal may then be deposited and patterned to form ohmic contacts 70 in the ohmic contact regions 15, 25, and 37. After the ohmic metal is patterned, the ohmic metal may be annealed to form low resistance electrical connections between the ohmic contacts 70 and the 2DEG inducing layer 50 exposed in the ohmic contact regions 15, 25, and 37.

A relatively thin insulator 80 (e.g., a nitride) may be applied over the ohmic contacts 70 to protect them during further processing. In some embodiments, the thin insulator 80 comprises only a single layer of insulator material. In some embodiments, the thin insulator 80 is about 15 nm, 25 nm, 50 nm, 75 nm, 100 nm, 200 nm, 400 nm, or 500 nm.

An opening in the thin insulator 80 may be formed to expose the gate stack 55, and gate metal 90 may be deposited. Gate metal 90 may then be patterned to form gate contact 92 and field plate 94 of transistor 10, capacitor plate 96 of capacitor 20, and field plate 98 of Schottky diode 30.

An interlayer dielectric (ILD) 85 may be formed over the gate metal structures, and may be etched to form openings for vias 95 to electrically connect the ohmic contacts 70, the Schottky contact 34, and the gate metal structures to source/drain electrodes 12, gate electrode 14, field plate electrode 16, capacitor electrodes 22, and cathode and anode electrodes 32, which are formed by depositing and etching a metal layer.

Additional or alternative structures and process may be used.

In some embodiments of the invention, a metal layer proximate a 2DEG inducing layer may be formed so that it is separated from the 2DEG inducing layer by a relatively thin insulating layer. Illustrative examples are provided below showing how the metal layer can be formed with minimal variation to the manufacturing process described above.

FIG. 2 is a cross-sectional view of a semiconductor device 100, which includes such metal layers proximate the 2DEG inducing layer. A method of manufacturing semiconductor device 100 is described below. Device 100 includes transistor 110, capacitor 120, and Schottky diode 130. Transistor 110 includes source/drain electrodes 112, gate electrode 114, and field plate electrode 116. Capacitor 120 includes electrodes 122, and Schottky diode 130 includes cathode and anode electrodes 132. Transistor 110, capacitor 120, and Schottky diode 130 are on GaN substrate 140, which may be similar or identical to GaN substrate 40 of device 1 of FIG. 1.

A 2DEG inducing layer 150 is over substrate 140. 2DEG inducing layer 150 may be similar or identical to 2DEG inducing layer 50 of device 1 of FIG. 1. Isolation regions 152 are electrically insulative, and may be similar or identical to isolation regions 52 of device 1 of FIG. 1.

A gate stack 155 is over the 2DEG inducing layer 150, and may be similar or identical to gate stack 55 of device 1 of FIG. 1.

A relatively thick insulator layer 160, is over gate stack 155, and may be similar or identical to thick insulator layer 60 of device 1 of FIG. 1.

Ohmic contacts 170 are in the ohmic contact regions 115, 125, and 137, which are formed openings in the insulator layer 160.

A relatively thin insulator 180 (e.g., a nitride) may be applied over the ohmic contacts 170 to protect them during further processing. The insulator 180 may be similar or identical to insulator 80 of device 1 of FIG. 1.

A gate metal 190 forms gate contact 192 and stepped field plate 194 of transistor 110, capacitor plate 196 of capacitor 120, and Schottky contact 134 and stepped field plate 198 of Schottky diode 130. In this embodiment, gate metal 190 comprises a Schottky metal. In some embodiments, for example, this metal could be nickel, platinum, palladium, molybdenum, tungsten, titanium, titanium nitride, titanium tantalum, tantalum nitride, cobalt, or silicides of these metals.

An interlayer dielectric (ILD) overlies the gate metal structures, through which vias electrically connect the ohmic contacts 170, the Schottky contact 134, and the other gate metal structures to source/drain electrodes 112, gate electrode 114, field plate electrode 116, capacitor electrodes 122, and cathode and anode electrodes 132.

Transistor 110 includes a stepped field plate 194. A first portion of stepped field plate 194 is separated from 2DEG inducing layer 150 by both the thick insulator layer 160 and the thin insulator 180. A second portion of stepped field plate 194 is separated from 2DEG inducing layer 150 by only the thin insulator 180.

One function of stepped field plate 194 is to selectively deplete the charge in the adjacent portions of the 2DEG inducing layer 150. When the charge is depleted, the 2DEG inducing layer 150 is nonconductive. As a result, the gate stack 155 does not experience high electric fields, which would otherwise be generated because of the high voltage difference between the gate and source drains 112. The stepped field plate 194 also improves the stability of the Vth by preventing charge injection and trapping at the gate stack 155 that would otherwise cause 2DEG carrier density reduction and higher on-state voltage drop.

Because the second portion stepped field plate 194 is separated from 2DEG inducing layer 150 by only the thin insulator 180, a minimal voltage difference between the stepped field plate 194 and the 2DEG inducing layer 150 may be used to deplete the charge in the adjacent portions of the 2DEG inducing layer 150. For example, in some embodiments, the 2DEG inducing layer 150 is substantially nonconductive as a result of a voltage difference between the stepped field plate 194 and the 2DEG inducing layer 150 being about 10 V, 20 V, 30 V, 40 V, or 50 V, where the potential of the stepped field plate 194 is less than the potential of the 2DEG inducing layer 150.

Capacitor 120 includes capacitor plate 196. A first portion of capacitor plate 196 is separated from 2DEG inducing layer 150 by both the thick insulator layer 160 and the thin insulator 180. A second portion of capacitor plate 196 is separated from 2DEG inducing layer 150 by only the thin insulator 180. Because the second portion of capacitor plate 196 is separated from 2DEG inducing layer 150 by only the thin insulator 180, capacitor 120 has a relatively high capacitance per area.

Schottky diode 130 includes stepped field plate 198. A first portion of stepped field plate 198 is separated from 2DEG inducing layer 150 by both the thick insulator layer 160 and the thin insulator 180. A second portion of stepped field plate 198 is separated from 2DEG inducing layer 150 by only the thin insulator 180. Because the second portion of stepped field plate 198 is separated from 2DEG inducing layer 150 by only the thin insulator 180, stepped field plate 198 has benefits similar to those of stepped field plate 194 of transistor 110.

FIG. 3 is a cross-sectional view of a semiconductor device 200, which includes metal layers proximate the 2DEG inducing layer. A method of manufacturing semiconductor device 200 is described below. Device 200 includes transistor 210, capacitor 220, and Schottky diode 230. Transistor 210 includes source/drain electrodes 212, gate electrode 214, and field plate electrode 216. Capacitor 220 includes electrodes 222, and Schottky diode 230 includes cathode and anode electrodes 232. Transistor 210, capacitor 220, and Schottky diode 230 are on GaN substrate 240, which may be similar or identical to GaN substrate 40 of device 1 of FIG. 1.

A 2DEG inducing layer 250 is over substrate 240. 2DEG inducing layer 250 may be similar or identical to 2DEG inducing layer 50 of device 1 of FIG. 1. Isolation regions 252 are electrically insulative, and may be similar or identical to isolation regions 52 of device 1 of FIG. 1.

A gate stack 255 is over the 2DEG inducing layer 250, and may be similar or identical to gate stack 55 of device 1 of FIG. 1. A relatively thick insulator layer 260, is over gate stack 255, and may be similar or identical to thick insulator layer 60 of device 1 of FIG. 1. In this embodiment, thick insulator layer 260 comprises first and second insulator layers 260a and 260b. In some embodiments, each of the first and second insulator layers 260a and 260b comprises only a single insulator layer. In some embodiments, first and second insulator layers 260a and 260b respectively comprise first and second insulator materials, where the first insulator material is different from the second insulator material.

Ohmic contacts 270 are in the ohmic contact regions 215, 225, and 237, which are formed openings in the insulator layer 260. In addition, a Schottky contact 234 is in another opening in the insulator layer 260. A relatively thin insulator 280 (e.g., a nitride) may be applied over the ohmic contacts 270 to protect them during further processing. The insulator 280 may be similar or identical to insulator 80 of device 1 of FIG. 1.

A gate metal 290 forms gate contact 292 and stepped field plate 294 of transistor 210, capacitor plate 296 of capacitor 220, and a portion of stepped field plate 298 of Schottky diode 230.

An interlayer dielectric (ILD) overlies the gate metal structures, through which vias electrically connect the ohmic contacts 270, the Schottky contact 234, and the gate metal structures to source/drain electrodes 212, gate electrode 214, field plate electrode 216, capacitor electrodes 222, and cathode and anode electrodes 232.

Transistor 210 includes a stepped field plate 294. A first portion of stepped field plate 294 is separated from 2DEG inducing layer 250 by both layers 260a and 260b of the thick insulator layer 260. A second portion of stepped field plate 294 is separated from 2DEG inducing layer 250 by only the insulator layer 260a of the thick insulator layer 260.

For reasons similar to those discussed above with reference to step field plate 194 of transistor 110 illustrated in FIG. 2, because the second portion stepped field plate 294 is separated from 2DEG inducing layer 250 by only the insulator layer 260a of the thick insulator layer 260, a minimal voltage difference between the stepped field plate 294 and the 2DEG inducing layer 250 may be used to deplete the charge in the adjacent portions of the 2DEG inducing layer 250. For example, in some embodiments, the 2DEG inducing layer 250 is substantially nonconductive as a result of a voltage difference between the stepped field plate 294 and the 2DEG inducing layer 250 being about 10 V, 20 V, 30 V, 40 V, or 50 V, where the potential of the stepped field plate 294 is less than the potential of the 2DEG inducing layer 250.

Capacitor 220 includes capacitor plate 296. A first portion of capacitor plate 296 is separated from 2DEG inducing layer 250 by both layers 260a and 260b of the thick insulator layer 260. A second portion of capacitor plate 296 is separated from 2DEG inducing layer 250 by only the insulator layer 260a of the thick insulator layer 260. Because the second portion of capacitor plate 296 is separated from 2DEG inducing layer 250 by only the insulator layer 260a of the thick insulator layer 260, capacitor 220 has a relatively high capacitance per area.

Schottky diode 230 includes stepped field plate 298. A first portion of stepped field plate 298 is separated from 2DEG inducing layer 250 by both layers 260a and 260b of the thick insulator layer 260. A second portion of stepped field plate 298 is separated from 2DEG inducing layer 250 by only the insulator layer 260a of the thick insulator layer 260. Because the second portion of stepped field plate 298 is separated from 2DEG inducing layer 250 by only the insulator layer 260a of the thick insulator layer 260, stepped field plate 298 has benefits similar to those of stepped field plate 294 of transistor 210.

FIG. 4 is a cross-sectional view of a semiconductor device 300, which includes metal layers proximate the 2DEG inducing layer. A method of manufacturing semiconductor device 300 is described below. Device 300 includes transistor 310, capacitor 320, and Schottky diode 330. Transistor 310 includes source/drain electrodes 312, gate electrode 314, and field plate electrode 316. Capacitor 320 includes electrodes 322, and Schottky diode 330 includes cathode and anode electrodes 332. Transistor 310, capacitor 320, and Schottky diode 330 are on GaN substrate 340, which may be similar or identical to GaN substrate 40 of device 1 of FIG. 1.

A 2DEG inducing layer 350 is over substrate 340. 2DEG inducing layer 350 may be similar or identical to 2DEG inducing layer 50 of device 1 of FIG. 1. Isolation regions 352 are electrically insulative, and may be similar or identical to isolation regions 52 of device 1 of FIG. 1.

A gate stack 355 is over the 2DEG inducing layer 350, and may be similar or identical to gate stack 55 of device 1 of FIG. 1. A relatively thick insulator layer 360, is over gate stack 355, and may be similar or identical to thick insulator layer 60 of device 1 of FIG. 1.

Ohmic contacts 370 are in the ohmic contact regions 315, 325, and 337, which are formed openings in the insulator layer 360. In addition, a Schottky contact 334 is in another opening in the insulator layer 360. A relatively thin insulator 380 (e.g., a nitride) may be applied over the ohmic contacts 370 to protect them during further processing. The insulator 380 may be similar or identical to insulator 80 of device 1 of FIG. 1.

A gate metal 390 forms gate contact 392 and stepped field plate 394 of transistor 310, capacitor plate 394 of capacitor 320, and a portion of stepped field plate 398 of Schottky diode 330.

An interlayer dielectric (ILD) overlies the gate metal structures, through which vias electrically connect the ohmic contacts 370, the Schottky contact 334, and the gate metal structures to source/drain electrodes 312, gate electrode 314, field plate electrode 316, capacitor electrodes 322, and cathode and anode electrodes 332.

Transistor 310 includes a stepped field plate 394. A first portion of stepped field plate 394 is separated from 2DEG inducing layer 350 by the entire thickness of thick insulator layer 360. A second portion of stepped field plate 394 is separated from 2DEG inducing layer 350 by only a portion of the thickness of thick insulator layer 360.

For reasons similar to those discussed above with reference to step field plate 194 of transistor 110 illustrated in FIG. 2, because the second portion stepped field plate 394 is separated from 2DEG inducing layer 350 by only a portion of the thick insulator layer 360, a minimal voltage difference between the stepped field plate 394 and the 2DEG inducing layer 350 may be used to deplete the charge in the adjacent portions of the 2DEG inducing layer 350. For example, in some embodiments, the 2DEG inducing layer 350 is substantially nonconductive as a result of a voltage difference between the stepped field plate 394 and the 2DEG inducing layer 350 being about 10 V, 20 V, 30 V, 40 V, or 50 V, where the potential of the stepped field plate 394 is less than the potential of the 2DEG inducing layer 350.

Capacitor 320 includes capacitor plate 396. A first portion of capacitor plate 396 is separated from 2DEG inducing layer 350 by the entire thickness of thick insulator layer 360. A second portion of capacitor plate 396 is separated from 2DEG inducing layer 350 by only a portion of the thickness of the thick insulator layer 360. Because the second portion of capacitor plate 396 is separated from 2DEG inducing layer 350 by only a portion of the thickness of the thick insulator layer 360, capacitor 320 has a relatively high capacitance per area.

Schottky diode 330 includes stepped field plate 398. A first portion of stepped field plate 398 is separated from 2DEG inducing layer 350 by the entire thickness of the thick insulator layer 360. A second portion of stepped field plate 398 is separated from 2DEG inducing layer 350 by only a portion of the thickness of the thick insulator layer 360. Because the second portion of stepped field plate 398 is separated from 2DEG inducing layer 350 by only a portion of the thickness of the thick insulator layer 360, stepped field plate 398 has benefits similar to those of stepped field plate 394 of transistor 310.

FIGS. 5A-5F illustrate cross-sectional views of device 100 at various stages during a process of manufacturing the device 100.

Figure 5A:
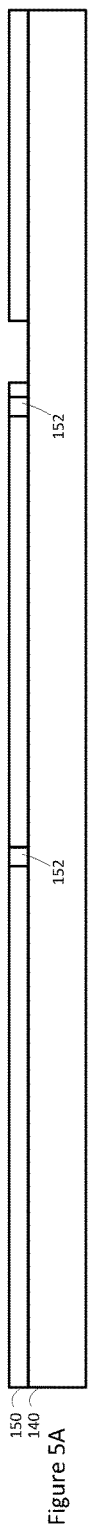
FIGS. 5A-5F illustrate cross-sectional views of a semiconductor device at various stages during a process of manufacturing the device.

FIG. 5A illustrates a cross-sectional view of device 100 after 2DEG inducing layer 150 has been formed on GaN substrate 140. In addition, isolation regions 152 have been formed. Furthermore, an opening in 2DEG inducing layer 150 exposing a portion of the GaN substrate 140 has been formed.

Figure 5B:
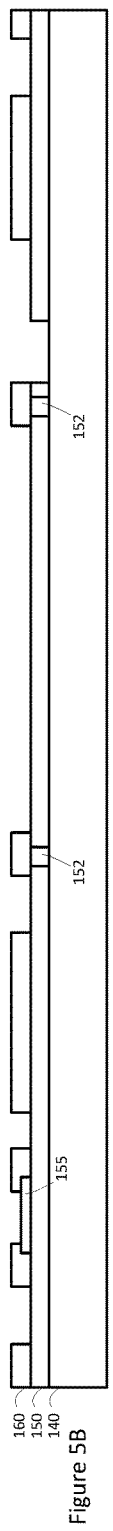

FIG. 5B illustrates a cross-sectional view of device 100 after gate stack 155 has been formed on 2DEG inducing layer 150. Gate stacks corresponding with insulated gates, Schottky gates, PN gates, recessed gates, and other gates may be used. In addition, thick insulator layer 160 has been formed over the gate stack 155 and 2DEG inducing layer 150. Furthermore, as illustrated, openings in the thick insulator 160 have also been formed.

Figure 5C:
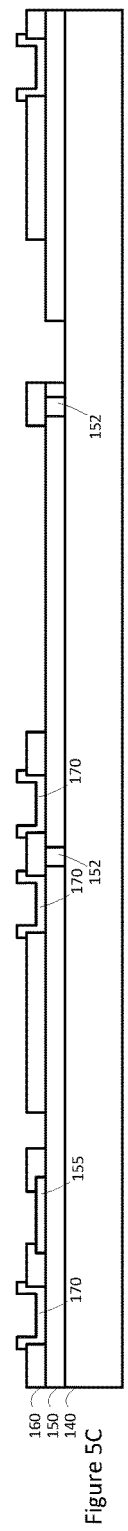

FIG. 5C illustrates a cross-sectional view of device 100 after an ohmic metal has been deposited and patterned, for example, by partially covering with a photoresist and etching, to form ohmic contacts 170 to the 2DEG inducing layer 150 in certain openings of the thick insulator layer 160.

Figure 5D:
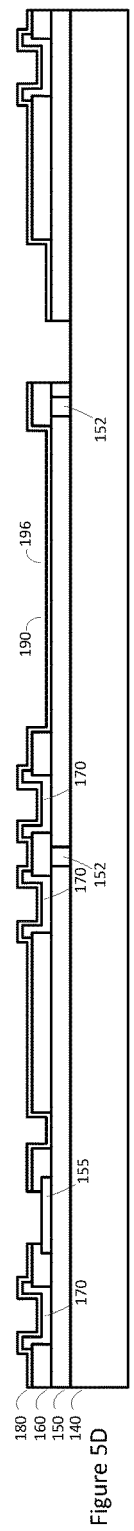

FIG. 5D illustrates a cross-sectional view of device 100 after relatively thin insulator 180 has been deposited over the ohmic metal contacts. In addition, as illustrated, a first opening exposing a portion of the GaN substrate 140 and a second opening exposing the gate stack 155 have been formed in insulator 180, for example, by etching.

Figure 5E:
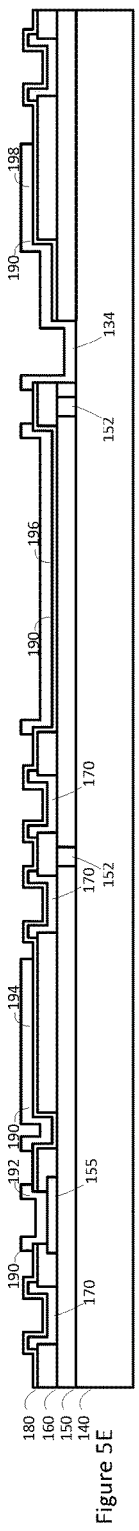

FIG. 5E illustrates a cross-sectional view of device 100 after gate metal 190 has been deposited. As illustrated, gate metal 190 has been patterned, and forms gate contact 192 and stepped field plate 194 of transistor 110, capacitor plate 196 of capacitor 120, and Schottky contact 134 and stepped field plate 198 of Schottky diode 130. In this embodiment, gate metal 190 comprises a Schottky metal. In some embodiments, for example, this metal could be nickel, platinum, palladium, molybdenum, tungsten, titanium, titanium nitride, titanium tantalum, tantalum nitride, cobalt, or silicides of these metals.

Figure 5F:
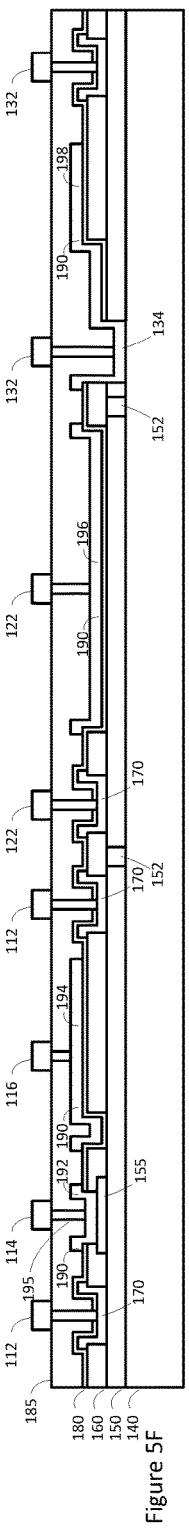

FIG. 5F illustrates a cross-sectional view of device 100 after interlayer dielectric 185, vias 195, source/drain electrodes 112, gate electrode 114, field plate electrode 116, capacitor electrodes 122, and diode cathode and anode electrodes 132 have been formed.

In some embodiments, additional processing may be performed. For example, the formation of additional interlayer dielectric layers, additional vias, additional metal layers, and top layer passivation may additionally be performed.

FIGS. 6A-6F illustrate cross-sectional views of device 200 at various stages during a process of manufacturing the device 200.

Figure 6A:
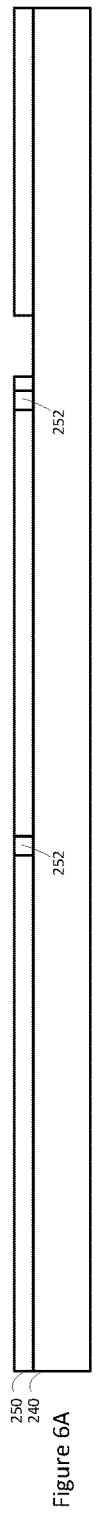
FIGS. 6A-6F illustrate cross-sectional views of a semiconductor device at various stages during a process of manufacturing the device.

FIG. 6A illustrates a cross-sectional view of device 200 after 2DEG inducing layer 250 has been formed on GaN substrate 240. In addition, isolation regions 252 have been formed. Furthermore, an opening in 2DEG inducing layer 250 exposing a portion of the GaN substrate 240 has been formed.

Figure 6B:
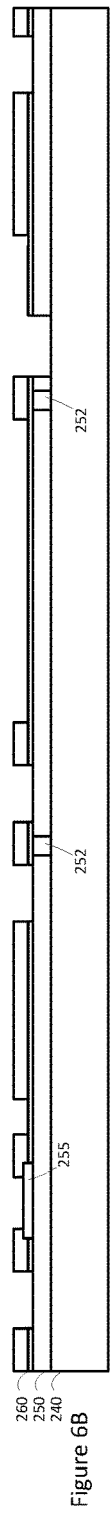

FIG. 6B illustrates a cross-sectional view of device 200 after gate stack 255 has been formed on 2DEG inducing layer 250. Gate stacks corresponding with insulated gates, Schottky gates, PN gates, recessed gates, and other gates may be used. In addition, thick insulator layer 260 has been formed over the gate stack 255 and 2DEG inducing layer 250.

In this embodiment, thick insulator layer 260 comprises first and second insulator layers 260a and 260b. In some embodiments, each of the first and second insulator layers 260a and 260b comprises only a single insulator layer. In some embodiments, first and second insulator layers 260a and 260b respectively comprise first and second insulator materials, where the first insulator material is different from the second insulator material.

Furthermore, as illustrated, openings in the thick insulator layer 260 have also been formed. Some of the openings are in the second insulator layer 260b and do not extend into the first insulator layer 260a. Others of the openings are in the second insulator layer 260b and also extend through the first insulator 260a.

Figure 6C:
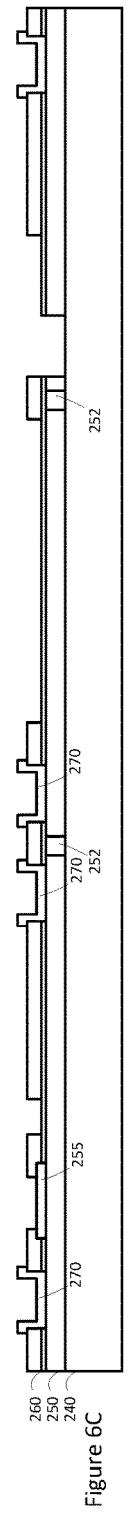

FIG. 6C illustrates a cross-sectional view of device 200 after an ohmic metal has been deposited and patterned, for example, by partially covering with a photoresist and etching, to form ohmic contacts 270 to the 2DEG inducing layer 250 in certain openings in the thick insulator layer 260.

Figure 6D:
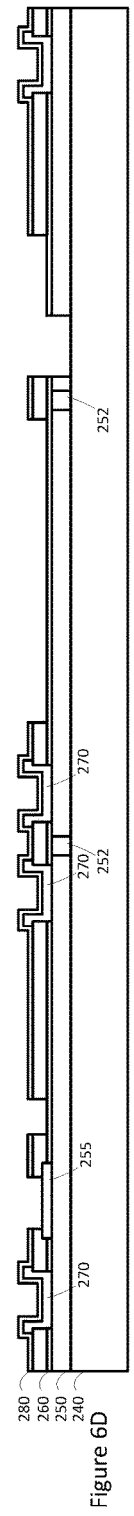

FIG. 6D illustrates a cross-sectional view of device 200 after relatively thin insulator 280 has been deposited over the ohmic metal contacts. In addition, as illustrated, a first opening exposing the gate stack 255, second and third openings exposing portions of the first insulator layer 260a of the thick insulator layer 260, and a fourth opening exposing a portion of the first insulator layer 260a of the thick insulator layer 260 and a portion of the GaN substrate 240 have been formed in insulator 280, for example, by etching.

Figure 6E:
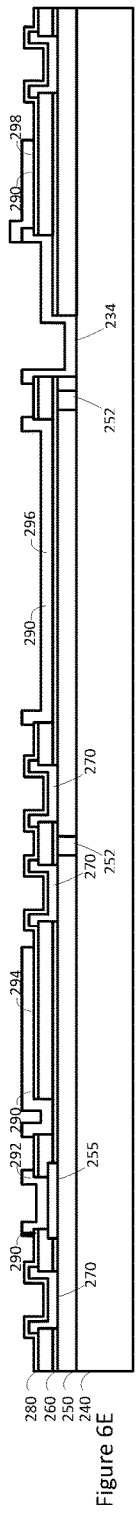

FIG. 6E illustrates a cross-sectional view of device 200 after Schottky contact 234 has been formed and gate metal 290 has been deposited. As illustrated, gate metal 290 has been patterned, and forms gate contact 292 and stepped field plate 294 of transistor 210, capacitor plate 296 of capacitor 220, and stepped field plate 298 of Schottky diode 230. In this embodiment, gate metal 290 comprises a conductor which may not be a Schottky metal. In some embodiments, for example, this metal could be nickel, platinum, palladium, molybdenum, tungsten, titanium, titanium nitride, titanium tantalum, tantalum nitride, cobalt, or silicides of these metals.

Figure 6F:
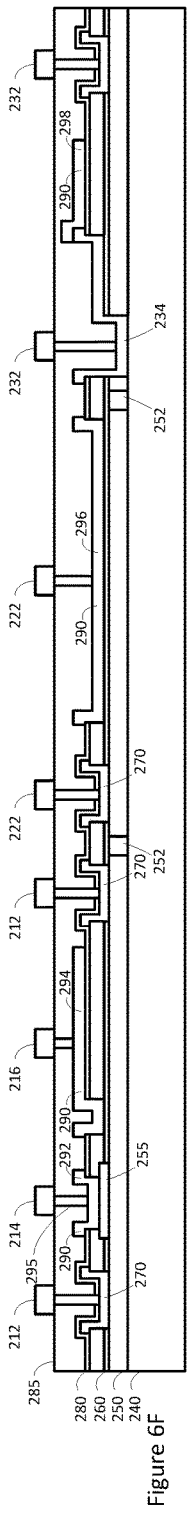

FIG. 6F illustrates a cross-sectional view of device 200 after interlayer dielectric 285, vias 295, source/drain electrodes 212, gate electrode 214, field plate electrode 216, capacitor electrodes 222, and diode cathode and anode electrodes 232 have been formed.

In some embodiments, additional processing may be performed. For example, the formation of additional interlayer dielectric layers, additional vias, additional metal layers, and top layer passivation may additionally be performed.

FIGS. 7A-7F illustrate cross-sectional views of device 300 at various stages during a process of manufacturing the device 300.

Figure 7A:
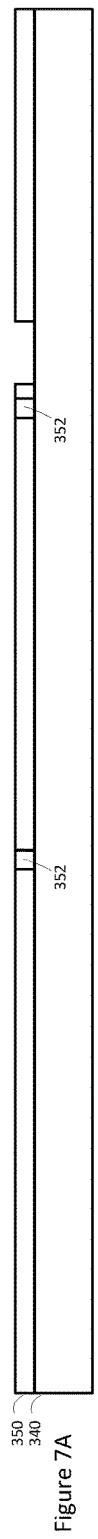
FIGS. 7A-7F illustrate cross-sectional views of a semiconductor device at various stages during a process of manufacturing the device.

FIG. 7A illustrates a cross-sectional view of device 300 after 2DEG inducing layer 350 has been formed on GaN substrate 340. In addition, isolation regions 352 have been formed. Furthermore, an opening in 2DEG inducing layer 350 exposing a portion of the GaN substrate 340 has been formed.

Figure 7B:
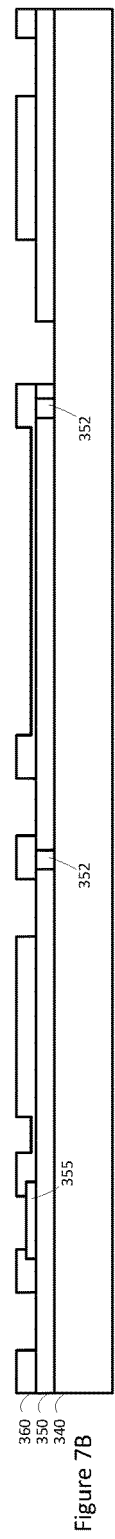

FIG. 7B illustrates a cross-sectional view of device 300 after gate stack 355 has been formed on 2DEG inducing layer 350. Gate stacks corresponding with insulated gates, Schottky gates, PN gates, recessed gates, and other gates may be used. In addition, thick insulator layer 360 has been formed over the gate stack 355 and 2DEG inducing layer 350.

Furthermore, as illustrated, openings in the thick insulator layer 360 have also been formed. Some of the openings do not extend through the insulator layer 360. Others of the openings extend through the insulator layer 360 and expose the 2DEG inducing layer 350.

Figure 7C:
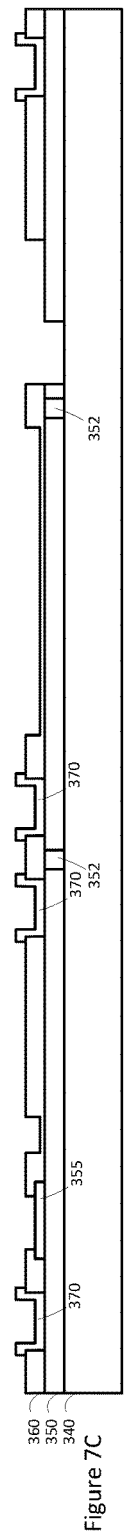

FIG. 7C illustrates a cross-sectional view of device 300 after an ohmic metal has been deposited and patterned, for example, by partially covering with a photoresist and etching, to form ohmic contacts 370 to the 2DEG inducing layer 350 in certain openings in the thick insulator layer 360.

Figure 7D:
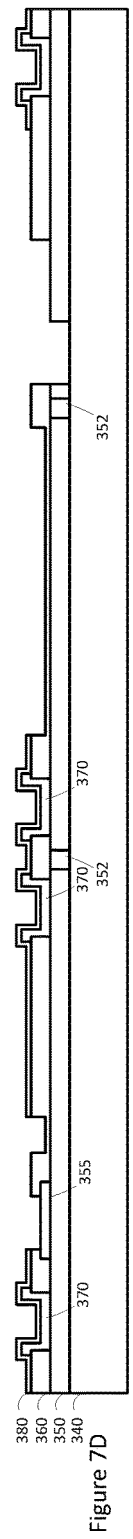

FIG. 7D illustrates a cross-sectional view of device 300 after relatively thin insulator 380 has been deposited over the ohmic metal contacts. In addition, as illustrated, a first opening exposing the gate stack 355 and a portion of the thick insulator layer 360, and a second opening exposing portions of the thick insulator layer 260, a portion of the 2DEG inducing layer 350, and a portion of the GaN substrate 340 have been formed in insulator 380, for example, by etching.

Figure 7E:
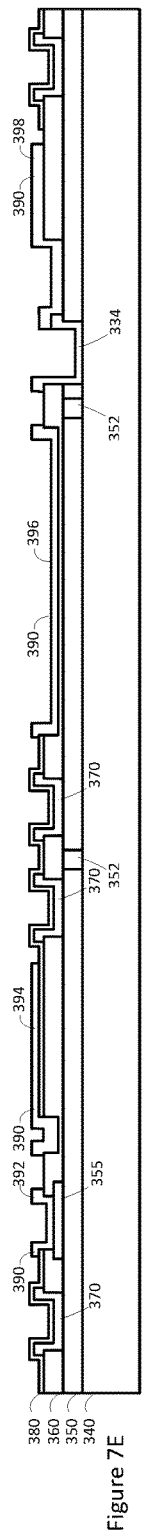

FIG. 7E illustrates a cross-sectional view of device 300 after Schottky contact 334 has been formed and gate metal 390 has been deposited. As illustrated, gate metal 390 has been patterned, and forms gate contact 392 and stepped field plate 394 of transistor 310, capacitor plate 396 of capacitor 320, and stepped field plate 398 of Schottky diode 330. In this embodiment, gate metal 390 comprises a conductor which may not be a Schottky metal. In some embodiments, for example, this metal could be nickel, platinum, palladium, molybdenum, tungsten, titanium, titanium nitride, titanium tantalum, tantalum nitride, cobalt, or silicides of these metals.

Figure 7F:
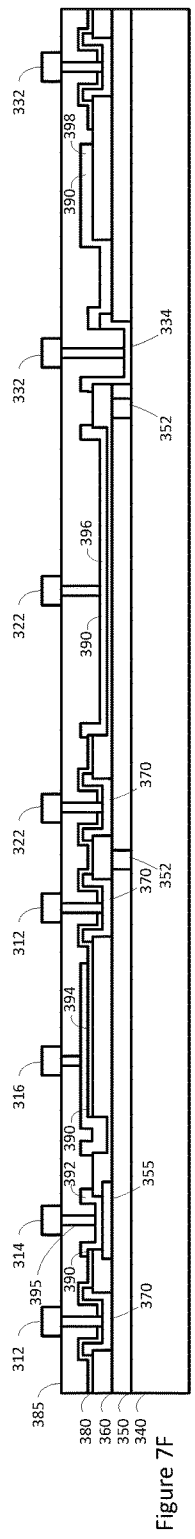

FIG. 7F illustrates a cross-sectional view of device 300 after interlayer dielectric 385, vias 395, source/drain electrodes 312, gate electrode 314, field plate electrode 316, capacitor electrodes 322, and diode cathode and anode electrodes 332 have been formed.

In some embodiments, additional processing may be performed. For example, the formation of additional interlayer dielectric layers, additional vias, additional metal layers, and top layer passivation may additionally be performed.

In alternative embodiments, instead of forming field plates with gate metal, the metal of the field plate electrode may be formed on the insulator(s) separating the field plate from the 2DEG inducing layer. For example, the metal of the field plate electrode may be deposited over the insulator(s) to make connection to the source ohmic layer through filled vias and to form a stepped field plate on three distinct levels. In a further embodiment, any of the sidewalls of the steps facing toward the drain can be tapered or sloped, which may provide a more optimum electric field distribution.

In alternative embodiments, one or more of the field plate of a HEMT, the field plate of a diode, and a capacitor plate may be spaced apart from the 2DEG inducing layer by a distance different from the distance one or more other of the field plate of the HEMT, the field plate of the diode, and the capacitor plate is spaced apart from the 2DEG inducing layer. For example, the field plate of the HEMT may be spaced apart from the 2DEG inducing layer by about 50 nm, 100 nm, or 150 nm, the field plate of the diode may be spaced apart from the 2DEG inducing layer by about 25 nm, 50 nm, or 75 nm, and the capacitor plate may be spaced apart from the 2DEG inducing layer by about 15 nm, 25 nm, or 50 nm.

The differing spacings from the 2DEG inducing layer to each of the field plate of the HEMT, the field plate of the diode, and the capacitor plate may be accomplished, for example, by placing different insulation layers between the 2DEG inducing layer and each of the field plate of the HEMT, the field plate of the diode, and the capacitor plate, where each of the different insulation has a different thickness. Alternatively, a common insulation may be placed between the 2DEG inducing layer and each of the field plate of the HEMT, the field plate of the diode, and the capacitor plate, where the common insulation layer is selectively etched.

In some embodiments, the various aspects discussed herein may be analogously applied to semiconductor devices configured to selectively form a two dimensional hole gas with a two dimensional hole gas inducing layer in place of a 2DEG inducing layer, with voltage polarities appropriately reversed.

Each of the embodiments discussed herein include one or more inventive features. The various features of the embodiments may be applied to other embodiments of devices in combinations of features which, for example, are contemplated, but not specifically discussed for the sake of brevity.

The various aspects of the devices discussed herein may be practiced in other semiconductor technologies. For example, the various aspects of the devices discussed herein may be practiced in Silicon, Germanium, Gallium Arsenide, Silicon Carbide, Organic, and other technologies.

While various embodiments of present invention have been described, it will be apparent to those of skill in the art that many more embodiments and implementations are possible that are within the scope of this invention. Accordingly, the present invention is not to be restricted except in light of the attached claims and their equivalents.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A semiconductor device, comprising:
   a substrate comprising GaN;
   a two dimensional electron gas (2DEG) inducing layer on the substrate;
   a lateral transistor on the 2DEG inducing layer, the lateral transistor comprising:
      source and drain contacts to the 2DEG inducing layer,
      a gate stack between the source and drain contacts, and
      a field plate between the gate and the drain contact;
   one or more insulation layers on the 2DEG inducing layer, wherein the field plate is spaced apart from the 2DEG inducing layer by the one or more insulation layers; and
   a capacitor, wherein at least a portion of a plate of the capacitor is formed at the same time and from the same material as the field plate.

2. The device of claim 1, wherein a first portion of the field plate is spaced apart from the 2DEG inducing layer by the one or more insulation layers by a distance less than 200 nm, and a second portion of the field plate is spaced apart from the 2DEG inducing layer by the one or more insulation layers by a distance greater than 200 nm.

3. The device of claim 1, wherein at least one of the one or more insulation layers contacts the first portion of the field plate and does not contact the second portion of the field plate.

4. The device of claim 1, wherein the field plate is configured to substantially prevent electronic conduction in a portion of the 2DEG inducing layer when applied with a potential of 40 V less than the adjacent 2DEG inducing layer.

5. The device of claim 1, further comprising a conductive gate contact contacting the gate stack, wherein the one or more insulation layers comprises first and second insulation layers, wherein a portion of the gate contact is spaced apart from the first insulation layer by the second insulation layer, and wherein the at least one insulation layer on the 2DEG inducing layer is the second insulation layer.

6. The device of claim 1, further comprising a diode having a field plate, wherein the field plate of the diode is formed at the same time and from the same material as the field plate of the lateral transistor.

7. The device of claim 6, further comprising a conductive gate contact contacting the gate stack, wherein the one or more insulation layers comprises first and second insulation layers, wherein a portion of the gate contact is spaced apart from the first insulation layer by the second insulation layer, and wherein the at least one insulation layer on the 2DEG inducing layer is the second insulation layer.

8. An electronic component, comprising:
   a package base; and
   at least one GaN-based die secured to the package base and including an electronic circuit comprising:
      a substrate comprising GaN;
      a two dimensional electron gas (2DEG) inducing layer on the substrate;
      a lateral transistor on the 2DEG inducing layer, the lateral transistor comprising:
         source and drain contacts to the 2DEG inducing layer,
         a gate stack between the source and drain contacts, and
         a field plate between the gate and the drain contact;
      one or more insulation layers on the 2DEG inducing layer, wherein the field plate is spaced apart from the 2DEG inducing layer by the one or more insulation layers; and
      a capacitor, wherein at least a portion of a plate of the capacitor is formed at the same time and from the same material as the field plate of the lateral transistor.

9. The component of claim 8, wherein a first portion of the field plate is spaced apart from the 2DEG inducing layer by the one or more insulation layers by a distance less than 200 nm, and a second portion of the field plate is spaced apart from the 2DEG inducing layer by the one or more insulation layers by a distance greater than 200 nm.

10. The component of claim 8, wherein at least one of the one or more insulation layers contacts the first portion of the field plate and does not contact the second portion of the field plate.

11. The component of claim 8, wherein the field plate is configured to substantially prevent electronic conduction in a portion of the 2DEG inducing layer when applied with a potential of 40 V less than the adjacent 2DEG inducing layer.

12. The component of claim 8, wherein the electronic circuit further comprises a conductive gate contact contacting the gate stack, wherein the one or more insulation layers comprises first and second insulation layers, wherein a portion of the gate contact is spaced apart from the first insulation layer by the second insulation layer, and wherein the at least one insulation layer on the 2DEG inducing layer is the second insulation layer.

13. The component of claim 12, wherein the electronic circuit further comprises a conductive gate contact contacting the gate stack, wherein the one or more insulation layers comprises first and second insulation layers, wherein a portion of the gate contact is spaced apart from the first insulation layer by the second insulation layer, and wherein the at least one insulation layer on the 2DEG inducing layer is the second insulation layer.

14. The device of claim 12, wherein a first portion of the field plate of the lateral transistor is spaced apart from the 2DEG inducing layer by the one or more insulation layers by a distance less than 200 nm, and wherein a second portion of the field plate of the lateral transistor is spaced apart from the 2DEG inducing layer by the one or more insulation layers by a distance greater than 200 nm.

15. The device of claim 12, wherein at least one of the one or more insulation layers contacts the first portion of the field plate of the lateral transistor and does not contact the second portion of the field plate of the lateral transistor.

16. The device of claim 12, further comprising a conductive gate contact contacting the gate stack, wherein the one or more insulation layers comprises first and second insulation layers, wherein a portion of the gate contact is spaced apart from the first insulation layer by the second insulation layer, and wherein the at least one insulation layer on the 2DEG inducing layer is the second insulation layer.

17. The device of claim 12, wherein the field plate is configured to substantially prevent electronic conduction in a portion of the 2DEG inducing layer when applied with a potential of 40 V less than the adjacent 2DEG inducing layer.

18. The device of claim 17, further comprising a conductive gate contact contacting the gate stack, wherein the one or more insulation layers comprises first and second insulation layers, wherein a portion of the gate contact is spaced apart from the first insulation layer by the second insulation layer, and wherein the at least one insulation layer on the 2DEG inducing layer is the second insulation layer.

19. The component of claim 8, wherein the electronic circuit further comprises a diode having a field plate, wherein the field plate of the diode is formed at the same time and from the same material as the field plate of the lateral transistor.

20. A semiconductor device, comprising:
    a substrate comprising GaN;
    a two dimensional electron gas (2DEG) inducing layer on the substrate;
    a lateral transistor on the 2DEG inducing layer, the lateral transistor comprising:
        source and drain contacts to the 2DEG inducing layer,
        a gate stack between the source and drain contacts, and
        a field plate between the gate and the drain contact;
    one or more insulation layers on the 2DEG inducing layer, wherein the field plate is spaced apart from the 2DEG inducing layer by the one or more insulation layers; and
    a diode having a field plate, wherein the field plate of the diode is formed at the same time and from the same material as the field plate of the lateral transistor.

* * * * *